(12) United States Patent
Lin

(10) Patent No.: US 6,218,314 B1
(45) Date of Patent: Apr. 17, 2001

(54) SILICON DIOXIDE-OXYNITRIDE CONTINUITY FILM AS A PASSIVATION FILM

(75) Inventor: Shih-Chi Lin, Taipei (TW)

(73) Assignee: Taiwan SemiConductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/283,850

(22) Filed: Apr. 1, 1999

(51) Int. Cl.$^7$ .................................................. H01L 21/469
(52) U.S. Cl. ............................................................ 438/761
(58) Field of Search ................................... 438/761, 762, 438/763, 769, 778, 786, 787, 792

(56) References Cited

U.S. PATENT DOCUMENTS

| | | | |
|---|---|---|---|
| 4,543,707 | * 10/1985 | Ito et al. | 29/578 |
| 4,901,133 | 2/1990 | Curran et al. | 357/54 |
| 5,616,401 | 4/1997 | Kobayashi et al. | 428/212 |
| 5,795,833 | * 8/1999 | Yu et al. | 438/763 |
| 5,946,542 | * 8/1999 | Iyer | 438/7 |

* cited by examiner

Primary Examiner—David Nelms
Assistant Examiner—Quoc Hoang
(74) Attorney, Agent, or Firm—George O. Saile; Stephen B. Ackerman; William J. Stoffel

(57) ABSTRACT

A method of fabrication of a silicon oxide-oxynitride (SOON) passivation film for a semiconductor device. A metal layer is formed over a dielectric layer. The invention's silicon oxide-oxynitride passivation film is formed composed of three layers: (1) a silicon oxide layer, (2) an oxide/oxynitride transition layer, and (3) a silicon oxynitride layer. Three insitu PECVD deposition steps form the three layers. In a first step, the silicon oxide layer is deposited. In the key second step the oxide/oxynitride transition layer is deposited. The oxide/oxynitride transitional layer's compositional ratio between oxygen and nitrogen varies in the thickness direction. The transition layer deposition is so controlled in deposition that the film has a portion near the silicon oxide layer which has a composition close to that of a silicon oxide film and that the transition layer has a composition closer to that of a silicon oxynitride film toward the top silicon oxynitride layer. In the third step the silicon oxynitride layer is deposited. The silicon oxide layer near the bottom creates a low stress contact with a metal line. The top oxynitride portion provides good scratch protection, moisture protection and a good diffusion barrier.

16 Claims, 2 Drawing Sheets

SILICON DIOXIDE-OXYNITRIDE CONTINUITY FILM AS A PASSIVATION FILM

BACKGROUND OF INVENTION

1) Field of the Invention

This invention relates generally to fabrication of a passivation layer composed of Silicon dioxide and oxynitride for a semiconductor device and more particularly to a process for forming a silicon dioxide-oxynitride continuity film that is part of a has three layers as a passivation film, inter metal dielectric or interlevel dielectric layer.

2) Description of the Prior Art

Once all the steps required to fabricate a working integrated circuit are completed, there still remains the important step of passivating the circuit, this is protecting it form possible contamination during its operating lifetime. Passivation layers are formed over metal lines to protect the metal lines and underlying semiconductor devices from moisture and other contaminants. It is known in the art to use two individually deposited layers for this purpose. One layer, such as silicon nitride and a second layer such as phosphosilicate glass (PSG) as a scavenger to neutralize contaminants already present.

However, current passivation layers formed of silicon nitride create too much stress on the metal lines and cause defects. Therefore, there is a need for a process to form a passivation layer that creates less stress and also has superior contamination and diffusion barrier properties.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,616,401 (Kobayashi) shows a oxynitride layer used as a oxidation mask for a field oxide process. U.S. Pat. No. 4,901,133 (Curran et al.) shows a Si rich SiON layer over a poly line.

SUMMARY OF THE INVENTION

It is an object of the present invention to provide a method for fabricating a passivation layer over metal lines that has a low stress and a good diffusion barrier and moisture barrier.

It is an object of the present invention to provide a method for a SOON passivation layer with a first portion near the bottom which has a composition close to silicon dioxide and a portion near the top that has a composition near silicon oxynitride.

It is an object of the present invention to provide a method for a SOON passivation layer with a first portion near the bottom which has a composition close to silicon dioxide and a portion near the top that has a composition near silicon oxynitride that reduces process steps.

To accomplish the above objectives, the present invention provides a method to forms a Silicon Oxide Oxynitride (SOON) passivation layer composed of three layers: ① a bottom silicon oxide layer 22, ② an oxide/oxynitride transition layer and ③ a top silicon oxynitride layer 26. The SOON passivation film 20 is deposited with a PECVD system. The SOON passivation layer can be used as an interlevel dielectric (ILD) layer, a interlevel dielectric (IDL) or a top passivation layer.

The SOON passivation layer is formed with a first portion near the bottom which has a composition close to silicon dioxide and a portion near the top that has a composition near silicon oxynitride.

The invention's method of fabrication of the silicon oxide-oxynitride passivation film for a semiconductor device includes the following. A metal layer 14 is formed over a dielectric layer 12 over a semiconductor structure 10.

A silicon oxide-oxynitride (SOON)passivation film 20 is formed composed of ① a silicon oxide layer 22, ② an oxide/oxynitride transition layer and ③ a (top) silicon oxynitride layer 26.

The oxide/oxynitride transitional layer has compositional ratio between oxygen and nitrogen that varies in the thickness direction thereof is formed on a main surface of the substrate, on which the silicon oxide layer 22 is formed. The transition layer 24 is so controlled in composition that the film has a portion nearest the substrate which has a composition close to that of a silicon oxide film and that the film has a composition closer to that of a silicon oxynitride film towards the top silicon oxynitride layer 26.

The transition layer preferably has a compositional ratio between nitrogen and oxygen that increases (preferably linearly) from the bottom surface to the top surface of the transition layer.

The substrate 10 is loaded into a plasma enhanced chemical vapor deposition chamber.

The passivation layer is formed by the following three steps.

STEP 1—The first step is performed for a first time period to form the silicon oxide layer 22. The first step is preferably performed at the following conditions: using a PECVD process and flowing a gas source of silicon and a gas source of oxygen to form the silicon dioxide layer.

STEP 2—The second step is performed for a second time period to form the oxide/oxynitride transition layer 24; at the following conditions: using a PECVD process and flowing a silicon gas source, an oxygen a gas source and a nitrogen gas source of where the nitrogen gas source flow rate is gradually increased during the second step. Preferably, initially, the nitrogen gas source flow is zero, during the step the ratio of Nitrogen source gas to Oxygen source gas is increased, and, at the end of the second step, the oxygen flow is equal or less than the nitrogen gas source flow.

STEP 3—The third step is performed for a third time period to form the oxynitride layer 26 at the following conditions: using a PECVD process and flowing a silicon gas source and an oxygen a gas source and a nitrogen gas source; so that the oxynitride layer ($Si_xO_yN_z$) has a molar composition where the x, Y and z values vary with final gas flow ratios. Preferably the oxynitride layer has a composition of about Nitrogen 33% oxygen 33% and Si 33%.

The substrate is then removed from the plasma enhanced chemical vapor deposition (PECVD) reactor.

The invention has the following benefits. The silicon oxide portion near the bottom creates a low stress contact with a metal line. The top oxynitride portion near the top of the SOON passivation layer provides good scratch protection, moisture protection and a good diffusion barrier.

The inventors has found that the invention's 3 layer 22 24 26 provides significant advantages over other multi-layer structures that include a silicon nitride layer, Si-rich oxynitride layer or near silicon nitride layer or portion. These SiN portions create excess stress. The invention's SOON passivation layer 20 reduces stress while provide better barrier protection.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well know process have not been described in detail in order to not unnecessarily obscure the present invention. Also, the flow rates in the specification can be scaled up or down keeping the same molar % or ratios to accommodate difference sized chambers/reactors as is known to those skilled in the art.

Semiconductor structure 10 is understood to possibly include a semiconductor wafer, active and passive devices formed within the wafer and conductive and dielectric layers formed on the wafer surface. The term "substrate" is mean to include devices formed within a semiconductor wafer and the layers overlying the wafer. The term "substrate surface" is meant to include the upper most exposed layers on a semiconductor wafer, such as a silicon surface, an insulating layer and metallurgy lines.

The invention forms a SOON passivation layer composed of three layers: ① a silicon oxide layer 22, ② an oxide/oxynitride transition layer and ③ a silicon oxynitride layer 26. The SOON passivation film 20 is deposited with a PECVD system.

The SOON passivation layer is formed with a first portion near the bottom which has a composition close to silicon dioxide and a portion near the top that has a composition near silicon oxynitride.

The silicon oxide portion near the bottom creates a low stress contact with a metal line. The top oxynitride portion near the top of the SOON passivation layer provides good scratch protection, moisture protection and a good diffusion barrier.

A key point of the invention is that the passivation film is deposited at about 400° C. This contrasts with the prior art that deposits the oxynitride layer at about 700° C. The invention's about 400° C. deposition temperature an advantage because the invention's lower temperature does not degrade metal layers.

Figure 2:
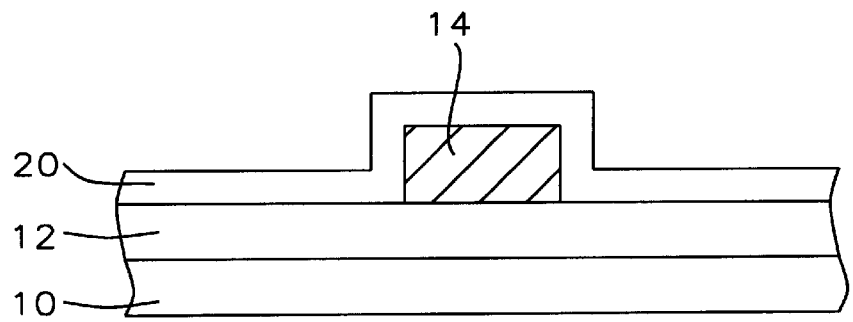
FIG. 2 is a cross section view of the SOON passivation layer 20 over a metal line according to the present invention.

FIG. 2 shows a cross sectional view of the invention's SOON passivation layer 20 over a metal line 14 over a dielectric layer 12 over the substrate 10.

A metal layer 14 is formed over a dielectric layer 12 over a substrate 10. The metal layer is preferably composed of an Al alloy or copper alloy.

The dielectric layer 12 is a inter metal dielectric (IMD) or interlevel dielectric (IDL) layer. An ILD layer is an insulating layer form on the substrate, but under inter metal dielectric (IMD) and metal layers. Inter metal dielectric layers are insulating layers that are formed between metal layers over the ILD layer.

Figure 1:
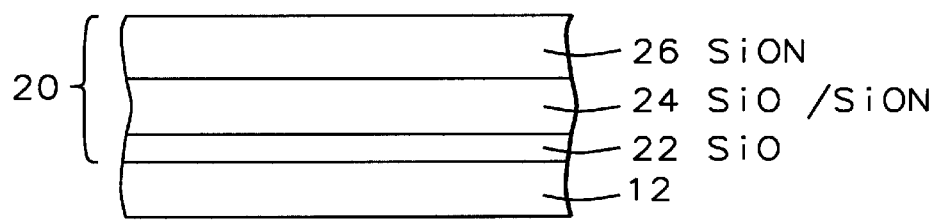
FIG. 1 is a cross section view of the SOON passivation layer 20 showing the three layers 22 24 26 of the present invention.

As shown in FIG. 1, The invention's silicon oxide-oxynitride passivation film 20 is formed composed of ① a silicon oxide layer 22, ② an oxide/oxynitride transition layer and ③ a silicon oxynitride layer 26.

The semiconductor structure 10 is loaded into a plasma enhanced chemical vapor deposition chamber.

The passivation layer is formed insitu by the following three steps.

All three steps are performed at the following conditions: a temperature between about 390 and 420° C.; a pressure between 860 and 1000 mtorr; a power between 1200 and 1600 W; and a power/(power on one wafer) (pcs) between 15 and 25.8 W.

The oxygen source gas is preferably $N_2O$ or NO and most preferably $N_2O$. The nitrogen source gas is preferably $NH_3$ or $N_2$ and most preferably $NH_3$. The Si source gas is preferably $SiH_4$. The process of the invention can be performed using other gasses as technology evolves and as is known in the art.

Step 1—oxide layer 22

A first step is performed for a first time period to form a silicon oxide layer 22. The silicon oxide layer has a minimal N content. The first step is performed at the following conditions: a temperature between about 390 and 420° C.; a pressure between 860 and 1000 mtorr; a power between 1200 and 1600 W; the first time period is between 5 and 10 minutes; a $SiH_4$ flow between 80 and 320 sccm; and a $N_2O$ flow between 850 and 1950 sccm. These parameters can be scaled up or down keeping the gases and other parameters in proportions.

The oxide layer 22 preferably has a molar % of N: 0%, O 66% +/−5% and Si 33% +/−5% (e.g., $SiO_2$).

In an other aspect of the invention. The layer 22 can be composed of FSG (flouro silicon glass) formed using $C_2F_6$ or $CF_4$ reactant gasses.

Figure 3:
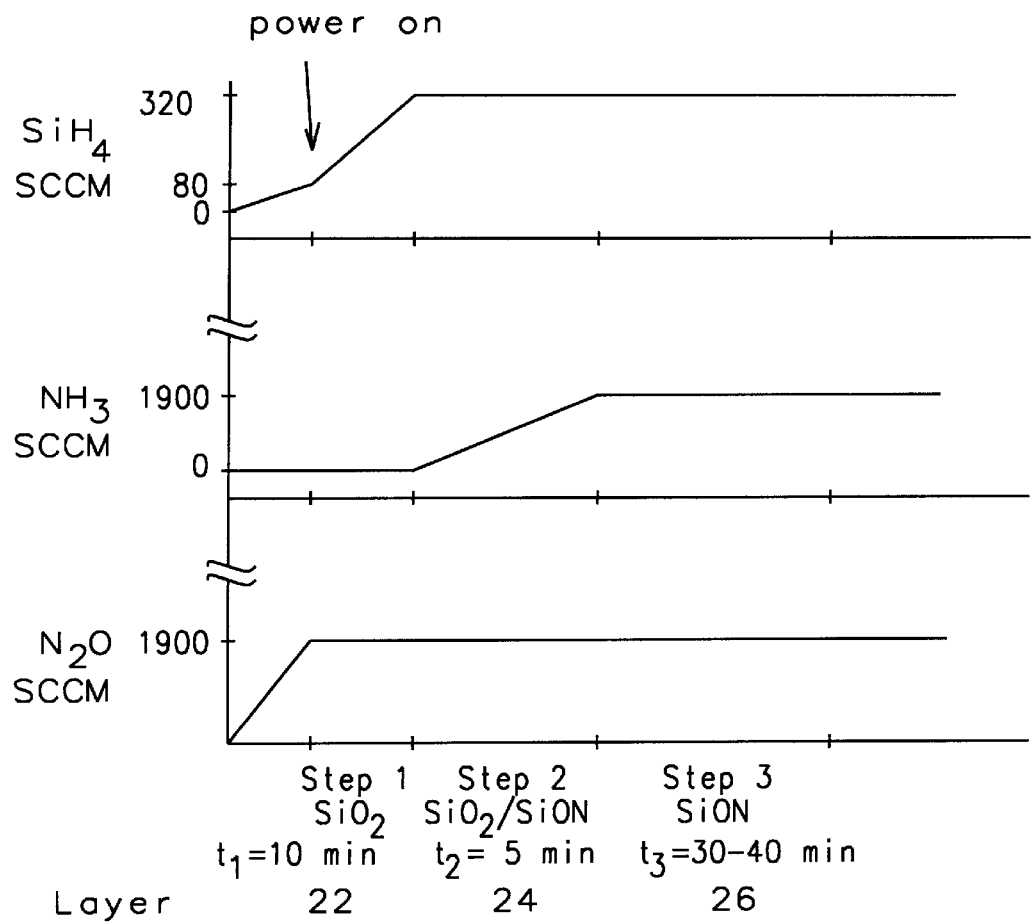
FIG. 3 is graph of the flow rates of the feed gasses used to form the passivation film according to the present invention.

FIG. 3 shows a graph of the flow rates for the three steps.
Second step—oxide/oxynitride transition layer 24

The oxide/oxynitride transitional layer 24 whose compositional ratio between oxygen and nitrogen varies in the thickness direction thereof is formed on a main surface of a the substrate, on which a silicon oxide layer 22 is formed. The transition layer 24 is so controlled in composition that the film has a portion near the silicon substrate which has a composition close to that of a silicon oxide film and that the film has a composition closer to that of a silicon oxynitride film toward the top silicon oxynitride layer 26.

The transition layer preferably has a compositional ratio between nitrogen and oxygen that increases from the bottom surface to the top surface.

A second step is performed for a second time period to form an oxide/oxynitride transition layer 24 at the following conditions:

a $SiH_4$ flow between 300 and 340 sccm; a $NH_3$ flow between 0 and 1900 sccm where the flow rate of $NH_3$ is preferably linearly (+/−5%) increased from 0 to 1900 over the second time period;

a $N_2O$ flow between 1850 and 1950 sccm.

The flow conditions/rates for all three steps can be scaled up or down for different sized reactors. The graded oxide/oxynitride layer 24 preferably has a thickness of between about 500 and 1000 Å.

Third step—oxynitride layer 26

The third step performed for a third time period to form an oxynitride layer 26 at the following conditions: a $SiH_4$ flow between 300 and 340 sccm; a $NH_3$ flow between 1850 and 1950 sccm and a $N_2O$ flow between 1850 and 1950 sccm.

The oxynitride layer 26 preferably has a thickness of between about 4000 and 6000 Å.

The substrate is removed from the plasma enhanced chemical vapor deposition (PECVD) reactor.

Characterization of the layers

The passivation film 20 has a refractive index between 1.69 and 1.73 at a wavelength of 546 nm and a stress of −1.0 E9 to −4.0 E9 dyne/cm2 units.

The silicon oxide-oxynitride passivation layer 20 preferably has a thickness of between about 6000 and 9000 Å.

The oxide layer 22 preferably has a index of refraction between 1.45 and 1.53 at a wave length of 546 nm; and the oxide/oxynitride transition layer 24 preferably has a index of refraction between 1.6 and 1.7 and the oxynitride layer 26 preferably has an index of refraction of 1.73 to 1.78.

The inventors performed experiments to measure the dielectric constants of the layers. The inventors found that the oxide layer 22 has a (dielectric constant) K of about 3.8 and more preferably between 3.6 and 4.0. The oxide/oxynitride transition layer 24 has a K (k2) between 4.8 and 5.0 and the oxynitride layer 26 has a K (K3) between 5.6 and 5.8. Therefore when the thickness (d2) of the transition layer 24 is increased, the Capacitance (c) increases.

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to an understanding of the present invention, exemplary technical data are set forth based upon current technology. Future developments in the art may call for appropriate adjustments as would be obvious to one skilled in the art. The parameters for the steps in the invention can be scaled up or down as is known by those skilled in the art and the flow rates should be considered molar ratios.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of a silicon oxide-oxynitride passivation film as a passivation film for a semiconductor device; comprising:

forming metal layer over a dielectric layer over a semiconductor structure; said metal layer composed of an Al alloy;

forming a silicon oxide-oxynitride passivation film composed of three layers of (1) a silicon oxide layer, (2) an oxide/oxynitride transition layer and (3) a silicon oxynitride layer; said oxide/oxynitride transition layer has a bottom surface at the side of said semiconductor structure and a top surface opposite said bottom surface; a compositional ratio between nitrogen and oxygen increases from said bottom surface to said top surface;

loading said substrate into a plasma enhanced chemical vapor deposition chamber;

said silicon oxide-oxynitride passivation film formed in a three step in-situ PECVD deposition process as follows:

a) performing a first step for a first time period to form a silicon oxide layer; said first step is performed at the following conditions: using a PECVD process and flowing a gas source of silicon and a gas source of oxygen to form said silicon oxide layer;

b) performing a second step performed for a second time period to form an oxide/oxynitride transition layer at the following conditions: using a PECVD process and flowing a silicon gas source, an oxygen gas source and a nitrogen gas source of where said nitrogen gas source is gradually increased during said second step;

c) performing a third step for a third time period to form a oxynitride layer at the following conditions: using a PECVD process and flowing a silicon gas source and an oxygen gas source and a nitrogen gas source; so that said oxynitride layer has a molar composition of Nitrogen between 30 and 36%, oxygen between 30 and 36%; and Si between 30 and 36%; and removing said substrate from said plasma enhanced chemical vapor deposition (PECVD) chamber.

2. The method of claim 1 wherein said dielectric layer is an inter metal dielectric (IMD) or an interlevel dielectric (IDL) layer.

3. The method of claim 1 wherein said second step further comprises: initially said nitrogen gas source flow is zero and at the end of said second step, said oxygen flow is about equal to said nitrogen gas source flow.

4. The method of claim 1 wherein said silicon source gas is $SiH_4$, said Nitrogen source gas is $NH_3$, and said oxygen source gas is $N_2O$.

5. The method of claim 1 wherein said passivation film has a refractive index between 1.69 and 1.73 at a wavelength of 546 nm; and a stress of −1.0 E9 to −4.0 E9 dyne/cm2 units.

6. The method of claim 1 wherein the first, second and third steps are performed at a temperature between about 390 and 420° C.; a pressure between 860 and 1000 mtorr; a power between 1200 and 1600 W; and a power/PCS between 15 and 25.8 W.

7. The method of claim 1 wherein said silicon oxide-oxynitride passivation layer have a thickness of between about 6000 and 9000 Å.

8. The method of claim 1 wherein said oxide layer having a index of refraction between 1.45 and 1.52 and said oxide/oxynitride transition layer having a index of refraction between 1.6 and 1.7 and said oxynitride layer having a index of refraction of between 1.73 and 1.78.

9. The method of claim 1 wherein said first step is performed at the following conditions: a temperature between about 390 and 420° C.; a pressure between 860 and 1000 mtorr; a power between 1200 and 1600 W; said first time period is between 5 and 10 minutes; a $SiH_4$ flow between 80 and 320 sccm; a $N_2O$ flow between 1850 and 1950 sccm.

10. The method of claim 1 wherein said second step is performed for a second time period to form an oxide/oxynitride transition layer at the following conditions: a $SiH_4$ flow between 300 and 340 sccm; a $NH_3$ flow between 0 and 1900 sccm where the flow rate of $NH_3$ is linearly increased from 0 to 1900 over said second time period; a $N_2O$ flow between 1850 and 1950 sccm; said graded oxide/oxynitride layer having a thickness of between about 500 and 1000 Å.

11. The method of claim 1 wherein said third step performed for a third time period to form a oxynitride layer at the following conditions: a $SiH_4$ flow between 300 and 340 sccm; a $NH_3$ flow between 1880 and 1920 sccm; and a $N_2O$ flow between 1850 and 1950 sccm.

12. A method of fabrication of a silicon oxide-oxynitride passivation film as a passivation film for a semiconductor device; comprising:

forming metal layer over a dielectric layer over a semiconductor structure; said metal layer composed of an Al alloy;

forming a silicon oxide-oxynitride passivation film composed of (1) a silicon oxide layer, (2) an oxide/oxynitride transition layer and (3) a silicon oxynitride layer by the following steps:

loading said semiconductor structure into a plasma enhanced chemical vapor deposition chamber:

a) performing a first step for a first time period to form said silicon oxide layer; said first step is performed at the following conditions: a temperature between about 390 and 420° C.; a pressure between 860 and 1000 mtorr; a power between 1200 and 1600 W; said first time period is between 5 and 10 minutes; a $SiH_4$ flow between 160 and 320 sccm; a $N_2O$ flow between 1850 and 1920 sccm;

b) performing a second step for a second time period to form said oxide/oxynitride transition layer at the following conditions: a $SiH_4$ flow between 300 and 340 sccm; a $NH_3$ flow between 0 and 1900 sccm where the flow rate of $NH_3$ is linearly increased from 0 to 1900 over said second time period; a $N_2O$ flow between 1850 and 1950 sccm; said graded oxide/oxynitride layer having a thickness of between about 500 and 1000 Å;

c) a third step performed for a third time period to form said oxynitride layer at the following conditions: a $SiH_4$ flow between 300 and 340 sccm; a $NH_3$ flow between 1850 and 1950 sccm; a $N_2O$ flow between 1850 and 1950 sccm; said oxynitride layer having a thickness of between about 4000 and 6000 Å; said passivation film has a refractive index between 1.73 and 1.78 at a wavelength of 546 nm; and removing said substrate from said plasma enhanced chemical vapor deposition (PECVD) reactor.

13. The method of claim 12 wherein said steps 1, 2, and 3 are performed at a temperature between about 390 and 420° C.; a pressure between 860 and 1000 mtorr; a power between 1200 and 1600 W; and a power/pcs between 15 and 25.8 W.

14. The method of claim 12 wherein said silicon oxide-oxynitride passivation layer has a thickness of between about 6000 and 9000 Å.

15. The method of claim 12 wherein said oxide layer has a index of refraction between 1.69 and 1.73 and said oxide/oxynitride transition layer having a index of refraction between 1.6 and 1.7 and said oxynitride layer having a index of refraction of 1.73 to 1.78.

16. The method of claim 12 wherein said dielectric layer is a inter metal dielectric (IMD) or interlevel dielectric (IDL) layer.

* * * * *